United States Patent
Ptacek et al.

(10) Patent No.: US 12,191,847 B2
(45) Date of Patent: Jan. 7, 2025

(54) METHOD AND SYSTEM OF OPERATING A GATE DRIVER

(71) Applicant: SEMICONDUCTOR COMPONENTS INDUSTRIES, LLC, Scottsdale, AZ (US)

(72) Inventors: Karel Ptacek, Roznov pod Radhostem (CZ); Jaroslav Knop, Radslavice (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 142 days.

(21) Appl. No.: 18/301,952

(22) Filed: Apr. 17, 2023

(65) Prior Publication Data

US 2024/0348243 A1   Oct. 17, 2024

(51) Int. Cl.
*H02M 1/08* (2006.01)
*H02M 7/537* (2006.01)
*H03K 17/082* (2006.01)

(52) U.S. Cl.
CPC .......... *H03K 17/0822* (2013.01); *H02M 1/08* (2013.01); *H02M 7/537* (2013.01); *H03K 2217/0063* (2013.01); *H03K 2217/0072* (2013.01)

(58) Field of Classification Search
CPC .... H02M 1/08; H02M 7/537; H03K 17/0822; H03K 2217/0063; H03K 2217/0072
USPC .................................. 327/108, 109, 110, 111
See application file for complete search history.

(56) References Cited

U.S. PATENT DOCUMENTS

| | | | | |
|---|---|---|---|---|
| 8,737,101 | B2* | 5/2014 | Cho | H02M 7/53803 363/131 |
| 10,985,673 | B1* | 4/2021 | Sato | H02M 3/1584 |
| 2005/0110475 | A1* | 5/2005 | Chapuis | H03K 17/165 323/282 |
| 2012/0099743 | A1 | 4/2012 | Ozaki | |
| 2013/0147458 | A1* | 6/2013 | Zhak | H02M 3/158 323/311 |
| 2015/0256074 | A1* | 9/2015 | Biondi | H02M 3/158 323/271 |
| 2018/0175841 | A1 | 6/2018 | Abesingha et al. | |
| 2019/0140635 | A1 | 5/2019 | Abesingha et al. | |
| 2020/0287456 | A1* | 9/2020 | Zuccollo | H02M 3/157 |
| 2021/0328510 | A1* | 10/2021 | Tang | H02M 3/1586 |

OTHER PUBLICATIONS

Semiconductor Components Industries, LLC, "High Voltage, High and Low Side Driver", NCP5106/D, Rev. 9, Feb. 2017, 21 pages.

* cited by examiner

*Primary Examiner* — William Hernandez
(74) *Attorney, Agent, or Firm* — Dickinson Wright PLLC; Mark E. Scott

(57) ABSTRACT

Operating a gate driver. At least one example is a method of operating the gate driver, the method comprising: de-asserting a drive-low terminal of the gate driver; starting a single timer within the gate driver; and after expiration of the single timer asserting a drive-high terminal of the gate driver responsive to assertion of an in-high terminal of the gate driver; and then de-asserting the drive-high terminal; starting the single timer; and after a second expiration of the single timer asserting the drive-low terminal responsive to assertion of an in-low terminal of the gate driver.

20 Claims, 6 Drawing Sheets

METHOD AND SYSTEM OF OPERATING A GATE DRIVER

CROSS-REFERENCE TO RELATED APPLICATIONS

Not Applicable.

BACKGROUND

Power converters many times implement a switch node which is alternately coupled to the input voltage and to ground. In such arrangements, a first electrically-controlled switch is implemented to couple the switch node to the input voltage, and a second switch is implemented to couple the switch node to the ground. If the electrically-controlled switches are both conductive at the same time, a direct short occurs between the input voltage and ground, sometimes referred to as shoot through. In order to reduce the chances of shoot through, many converters implement a delay time between making one electrically-controlled switch non-conductive and making the other electrically-controlled switch conductive.

SUMMARY

One example is a method of operating a gate driver, the method comprising: de-asserting a drive-low terminal of the gate driver; starting a single timer within the gate driver; and after expiration of the single timer asserting a drive-high terminal of the gate driver responsive to assertion of an in-high terminal of the gate driver; and then de-asserting the drive-high terminal; starting the single timer; and after a second expiration of the single timer asserting the drive-low terminal responsive to assertion of an in-low terminal of the gate driver.

In the example method, wherein each starting the single timer may comprise charging a capacitor by way of a current source; and wherein expiration of the single timer comprises a voltage on the capacitor meeting or exceeding a predetermined voltage.

The example method may further comprise implementing, by the gate driver, a state machine having at least four states: a first state in which the drive-high terminal is asserted and a timer-start input of the single timer is de-asserted; a second state in which the drive-high terminal is de-asserted and the timer-start input is asserted starting the single timer, the state machine transitions from the first state to the second state based on de-assertion of the in-high terminal; a third state in which the drive-low terminal is asserted and the timer-start input is de-asserted, the state machine transitions from the second state to the third state based on assertion of the in-low terminal and assertion of a timer-end output; a fourth state in which the drive-low terminal is de-asserted and the timer-start input is asserted, the state machine transitions from the third state to the fourth state based on de-assertion of the in-low terminal; and wherein the state machine transitions from the fourth state to the first state based on assertion of the in-high terminal and assertion of the timer-end output. The state machine may transition from the first state to the second state based on de-assertion of the in-high terminal and de-assertion of the timer-end output. The state machine may transition from the third state to the fourth state based on de-assertion of the in-low terminal and de-assertion of the timer-end output.

Another example is a gate driver, comprising: an in-high terminal, an in-low terminal, a drive-high terminal, and a drive-low terminal; a high-side amplifier defining a drive output coupled to the drive-high terminal, and a drive input; a low-side amplifier defining a drive output coupled to the drive-low terminal, and a drive input; a timer defining a timer-start input, and a timer-end output; and a controller coupled to the in-high terminal, the in-low terminal, the drive input of the high-side amplifier, the drive input of the low-side amplifier, the timer-start input, and the timer-end output. The controller may be configured to: insert a first delay time between de-assertion of the drive-high terminal and assertion of the drive-low terminal, the insertion of the first delay time based on the timer-end output; and insert a second delay time between de-assertion of the drive-low terminal and assertion of the drive-high terminal, the insertion of the second delay time based on the timer-end output.

In the example gate driver, wherein when the controller inserts the first delay time, the controller may be configured to de-assert the drive-high terminal, assert the timer-start input, and then assert the drive-low terminal upon assertion of the timer-end output; and wherein when the controller inserts the second delay time, the controller may be configured to de-assert the drive-low terminal, assert the timer-start input, and then assert the drive-high terminal upon assertion of the timer-end output.

In the example gate driver, the controller may further comprise a state machine having at least four states: a first state in which the drive-high terminal is asserted and the timer-start input is de-asserted; a second state in which the drive-high terminal is de-asserted and the timer-start input is asserted, the controller transitions from the first state to the second state based on de-assertion of the in-high terminal; a third state in which the drive-low terminal is asserted and the timer-start input is de-asserted, the controller transitions from the second state to the third state based on assertion of the in-low terminal and assertion of the timer-end output; a fourth state in which the drive-low terminal is de-asserted and the timer-start input is asserted, the controller transitions from the third state to the fourth state based on de-assertion of the in-low terminal; and wherein the controller transitions from the fourth state to the first state based on assertion of the in-high terminal and assertion of the timer-end output. The controller further may comprises a fifth state, the controller may transition to the fifth state upon detection of an under-voltage event. The controller may transition from the first state to the second state based on de-assertion of the in-high terminal and de-assertion of the timer-end output. The controller may transition from the third state to the fourth state based on de-assertion of the in-low terminal and de-assertion of the timer-end output.

In the example gate driver, the timer may comprise: a current source defining a current output; a capacitor defining a first lead coupled to the current output, and a second lead coupled to a reference voltage; an electrically-controlled switch defining a first lead coupled to the first lead of the capacitor, a second lead coupled to the second lead of the capacitor, and a control input defining the timer-start input; and a buffer defining a buffer input coupled to the first lead of the capacitor, and a buffer output defining the timer-end output.

Yet another example is a power converter comprising: a high-side FET defining a drain coupled to a voltage input, a source defining a switch node, and a gate; a low-side FET defining a drain coupled to the switch node, a source coupled to a reference voltage, and a gate; an inductance coupled to the switch node; a rectifier coupled to the inductance; a gate driver defining an in-high terminal, an in-low terminal, a drive-high terminal coupled to the gate of the high-side FET, and a drive-low terminal coupled to the gate of the low-side FET; a converter controller coupled to the in-high terminal and the in-low terminal, the converter controller configured to alternately assert the in-high terminal and the in-low terminal. The gate driver may be configured to: insert a first delay time between de-assertion of the drive-high terminal and assertion of the drive-low terminal based on a timer within the gate driver, and insert a second delay time between de-assertion of the drive-low terminal and assertion of the drive-high terminal based on the timer.

In the example power converter, wherein when the gate driver inserts the first delay time, the gate driver may be configured to de-assert the drive-high terminal, start the timer, and then assert the drive-low terminal upon assertion of a timer-end output; and wherein when the gate driver inserts the second delay time, the gate driver may be configured to de-assert the drive-low terminal, start the timer, and then assert the drive-high terminal upon assertion of the timer-end output.

In the example power converter, the timer may comprise: a current source defining a current output; a capacitor defining a first lead coupled to the current output, and a second lead coupled to a reference voltage; an electrically-controlled switch defining a first lead coupled to the first lead of the capacitor, a second lead coupled to the second lead of the capacitor, and a control input defining a timer-start input; and a buffer defining a buffer input coupled to the first lead of the capacitor, and a buffer output defining a timer-end output.

In the example power converter, the gate driver may further comprise a state machine having at least four states: a first state in which the drive-high terminal is asserted and a timer-start input is de-asserted; a second state in which the drive-high terminal is de-asserted and the timer-start input is asserted, the gate driver transitions from the first state to the second state based on de-assertion of the in-high terminal; a third state in which the drive-low terminal is asserted and the timer-start input is de-asserted, the gate driver transitions from the second state to the third state based on assertion of the in-low terminal and assertion of a timer-end output; a fourth state in which the drive-low terminal is de-asserted and the timer-start input is asserted, the gate driver transitions from the third state to the fourth state based on de-assertion of the in-low terminal; and wherein the gate driver transitions from the fourth state to the first state based on assertion of the in-high terminal and assertion of a timer-end output. The gate driver may transition from the first state to the second state based on de-assertion of the in-high terminal and de-assertion of the timer-end output. The gate driver may transition from the third state to the fourth state based on de-assertion of the in-low terminal and de-assertion of the timer-end output.

In the example power converter, the inductance may be an inductor having a first lead coupled to the switch node, and a second lead coupled to the rectifier.

In the example power converter, the inductance may be a transformer having a primary winding coupled to the switch node, and a secondary winding coupled to the rectifier.

BRIEF DESCRIPTION OF THE DRAWINGS

For a detailed description of example embodiments, reference will now be made to the accompanying drawings in which.

DEFINITIONS

Figure 1:
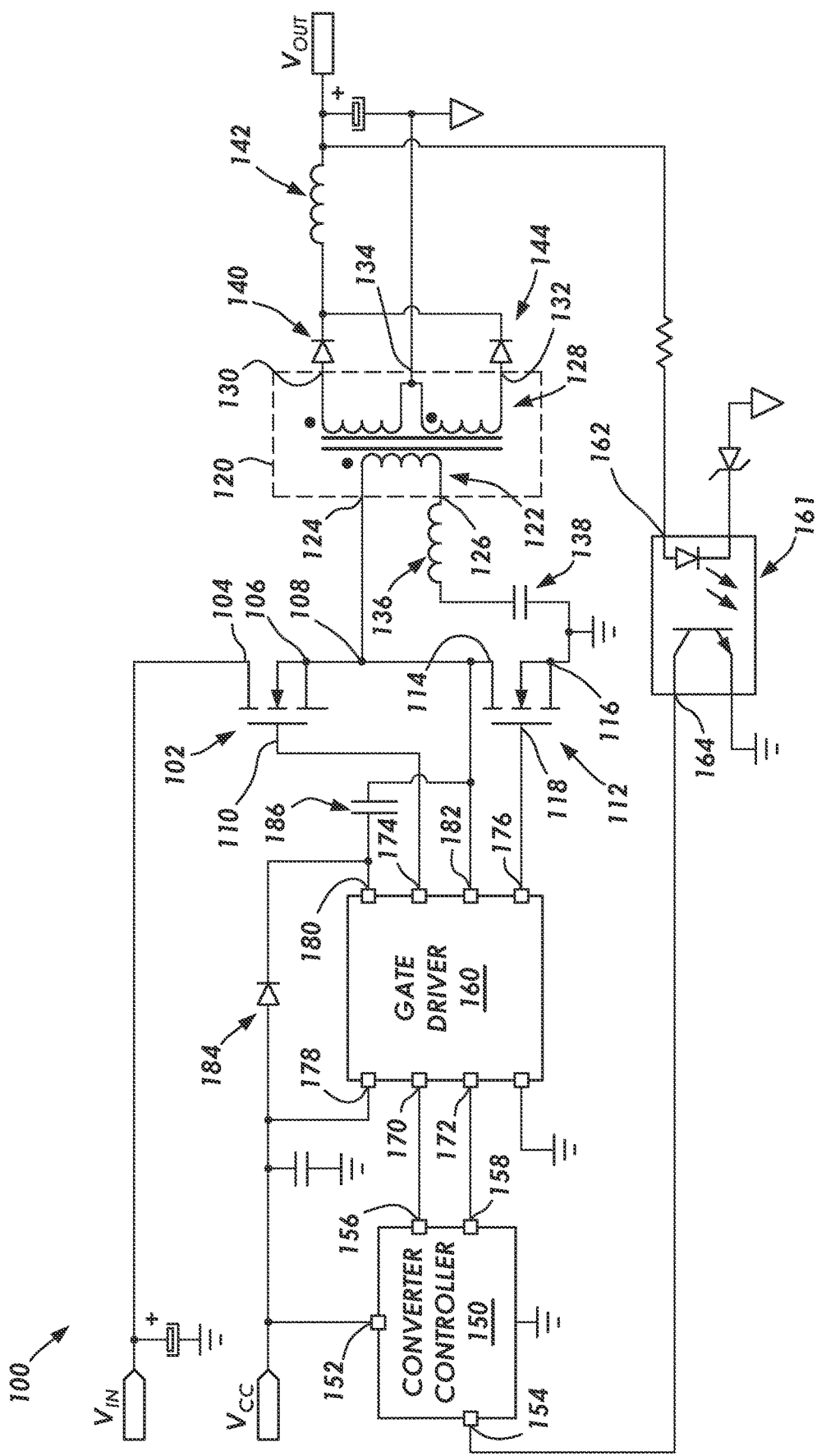
FIG. 1 shows an electrical schematic of a switching power converter in accordance with at least embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"AC" shall mean alternating current as those terms are understood within electrical engineering.

"DC" shall mean direct current as those terms are understood within electrical engineering.

"FET" shall mean a field effect transistor, such as a junction-gate FET (JFET) or metal-oxide-silicon FET (MOSFET).

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input. The "inputs" define electrical connections to the operational amplifier, and shall not be read to require inputting signals to the operational amplifier.

"Assert" shall mean creating or maintaining a first predetermined state of a Boolean signal. Boolean signals may be asserted high or with a higher voltage, and Boolean signals may be asserted low or with a lower voltage, at the discretion of the circuit designer. Similarly, "de-assert" shall mean creating or maintaining a second predetermined state of the Boolean, opposite the asserted state.

"Controller" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to switching power converters. More particularly, various examples are directed to operating a gate driver within a switching power converter. More particularly still, various examples are directed to gate drivers for use in switching power converters, where the gate drivers insert delay times between conductive states of a high-side FET and a low-side FET, and in which the delay times are generated by a single timer circuit to reduce variance. The specification first turns to an example switching power converter to orient the reader.

FIG. 1 shows an electrical schematic of an example switching power converter. In particular, the example power converter 100 comprises a high-side electrically-controlled switch illustratively shown as high-side FET 102; however, any suitable electrically-controlled switch may be used, such as junction transistor. The example high-side FET 102 defines drain 104 coupled to the input voltage $V_{IN}$, a source 106 coupled to a switch node 108, and a gate 110. The high-side FET 102 derives its name from either the location of the FET in many electrical schematics, or the fact the high-side FET 102 is coupled to the input voltage $V_{IN}$.

The example power converter 100 further comprises a low-side electrically-controlled switch illustratively shown as low-side FET 112. Here again, any suitable electrically-controlled switch may be used, such as junction transistor. The example low-side FET 112 defines drain 114 coupled to the switch node 108, a source 116 coupled to a reference voltage on the primary side (e.g., ground), and a gate 118. The low-side FET 112 derives its name from either the location of the FET in many electrical schematics, or the fact the low-side FET 12 is coupled to ground.

The example power converter 100 further comprises a transformer 120. The example transformer 120 defines a primary winding 122 with a first lead 124 coupled to the switch node 108, and a second lead 126. The primary winding 122 defines a primary side of the power converter 100. The second lead 126 of the primary winding 122 is coupled to an inductor 136 coupled in series with a capacitor 138. The lower lead of the capacitor 138 is coupled to the reference voltage on the primary side (e.g., ground). Thus, the example power converter 100 has an inductor-inductor-capacitor (LLC) resonant primary. Having an LLC resonant primary is merely an example, and other power converter types may be used, such as non-resonant half-bridge converters and full bridge power converters.

The example transformer 120 further comprises a secondary winding 128 with a first lead 130, a second lead 132, and a center tap 134. The secondary winding 128 is magnetically coupled to the primary winding 122. Thus, the secondary winding 128 defines a secondary side of the power converter 100 that is electrically isolated from the primary side. The first lead 130 of the secondary winding 128 is coupled to a rectifier in the example form of diode 140. In particular, the first lead 130 is coupled to the anode of the diode 140, and the diode 140 defines a cathode. In other examples, the rectifier on the secondary side may be an electrically-controlled switch, such as a FET, to reduce conduction loss compared to the diode 140. In the example of FIG. 1, the cathode of the diode 140 is coupled to the first lead of an inductor 142, and the second lead of the inductor 142 defines the output voltage $V_{OUT}$.

In the example of FIG. 1, the center tap 134 defines the reference voltage (e.g., common, return) on the secondary side. Based on the center-tap arrangement of the secondary winding 128, the example secondary side comprises a second rectifier in the example form of diode 144. In particular, the second lead 132 of the secondary winding 128 is coupled to the anode of the diode 144, and cathode of the diode 144 is coupled to the cathode of the diode 140. Much like the rectifier shown as diode 140, the rectifier shown as diode 144 may alternatively be an electrically-controlled switch, such as a FET, to reduce conduction loss. The center-tapped secondary winding 128 is merely an example. In other cases, the center tap 134 may be omitted, or left floating, the second lead 132 may define the reference voltage (e.g., common, return) on the secondary side, and a single rectifier may be used on the secondary side.

Still referring to FIG. 1, the example power converter 100 further comprises a converter controller 150. The converter controller 150 defines a power terminal 152, a feedback terminal 154, a drive-high terminal 156, and drive-low terminal 158. Additional terminals will be present, but the additional terminals are not shown so as not to unduly complicate the figure. The power terminal 152 is coupled to a source of DC operational power $V_{CC}$, such as about 8 V to about 12 V. The converter controller 150 receives a signal indicative of the output voltage $V_{OUT}$ by way of the feedback terminal 154.

In the example system with the electrically isolated primary and secondary sides, the signal indicative of the output voltage $V_{OUT}$ may be provided by way of an opto-coupler 161. The example opto-coupler 161 defines a sense input 162 coupled to the output voltage $V_{OUT}$, and sense output 164 coupled to the feedback terminal 154. Internally, the sense input 162 is coupled to a light-emitting diode (LED), and the sense output is coupled to the collector of transistor whose base is optically coupled to the LED. Thus, as the output voltage $V_{OUT}$ rises, the number of photons produced by the LED increases, and the conductivity of the transistor increases, and vice versa. Other coupling mechanisms may be used, such as capacitive isolation. In the case of non-isolated power converters, the feedback terminal 154 may couple to the output voltage $V_{OUT}$ directly, or through a voltage divider.

Based on the feedback signal and a setpoint, the converter controller 150 alternately asserts the drive-high terminal 156 and the drive-low terminal 158. The drive-high terminal 156 and the drive-low terminal 158 are coupled to the gate 110 of the high-side FET 102 and the gate 118 of the low-side FET 112, respectively, by way of a gate driver 160. The gate driver 160 is discussed in greater detail below. For now, consider that the gate driver 160 provides driving current to the gates 110 and 118 responsive to assertion of the drive-high terminal 156 and the drive-low terminal 158, respectively.

Still referring to FIG. 1, in operation as an LLC resonant power converter, the converter controller 150 asserts the drive-high terminal 156 at a 50% duty cycle and a variable frequency, the selected frequency depending on the load. Similarly, the converter controller 150 asserts the drive-low terminal 158 at a 50% duty cycle and at the variable frequency, but with an 180° phase difference compared to the drive-high terminal 156. For LLC resonant converters, the highest power is transferred across the transformer 120 when the operational frequency closely matches the resonant frequency of the LLC resonant primary. As load decreases, the frequency changes to compensate. Again, LLC resonant power converters are merely an example, and other types of converters are contemplated. For example, for a non-isolated converter, the converter controller 150 may control the power transfer to the output voltage $V_{OUT}$ using a fixed frequency, but varying the duty cycle of assertion of the drive-high terminal 156 and drive-low terminal 158 to control the length of each charge mode of an inductance feeding the output voltage $V_{OUT}$.

In an example operation of the power converter 100, in a first phase, the converter controller 150 asserts the drive-high terminal 156, making the high-side FET 102 conductive, and de-asserts the drive-low terminal 158, making the low-side FET 112 non-conductive. Thus, in the first phase the input voltage $V_{IN}$ is coupled to the switch node 108, and current flows through the high-side FET 102, through the primary winding 122, through the inductor 136, and to the capacitor 138. At a later point in time, the current flow through the primary winding 122 is reversed. That is, in a second phase, the converter controller 150 de-asserts the drive-high terminal 156, making the high-side FET 102 non-conductive, and asserts the drive-low terminal 158, making the low-side FET 112 conductive. Thus, in the second phase, energy stored on the capacitor 138 during the first phase creates current flow from the capacitor 138, through the inductor 136, through the primary winding 122, and then to ground on the primary side through the low-side FET 112. The net effect is an AC signal applied to the primary winding 122, which induces corresponding voltage and currents on the secondary winding 128.

Referring to the secondary side of the power converter 100. During the first phase in which the high-side FET 102 is conductive, a positive voltage is induced at the first lead 130 relative to the center tap 134. Thus, during the first phase, current flows from the first lead 130, through the diode 140, through the inductor 142, and then to the output voltage $V_{OUT}$. Still during the first phase, a negative voltage is induced at the second lead 132 of the secondary winding 128 relative to the center tap 134, and thus the diode 144 is revers biased and conducts no current.

Still referring to the secondary side of the power converter 100, but now turning to the second phase in which the low-side FET 112 is conductive. During the second phase, a positive voltage is induced at the second lead 132 relative to the center tap 134. Thus, current flows from the second lead 132, through the diode 144, through the inductor 142, and then to the output voltage $V_{OUT}$. Still during the second phase, a negative voltage is induced at the first lead 130 relative to the center tap 134, and thus the diode 140 is revers biased and conducts no current.

Still referring to FIG. 1, and returning to the primary side. The example switch node 108 is thus coupled to the input voltage $V_{IN}$ when the high-side FET 102 is conductive, and the switch node 108 is coupled to ground when the low-side FET 112 is conductive. If both the high-side FET 102 and the low-side FET 112 are either partially or fully conductive at the same time, the input voltage $V_{IN}$ is shorted to ground on the primary side. The short to ground, referred to as a shoot through, causes damage to the high-side FET 102 and/or the low-side FET 112, in some cases causing catastrophic damage. In order to reduce the likelihood of a shoot through, in many cases the converter controller 150 is designed and constructed to only assert one of the drive-high terminal 156 or the drive-low terminal 158 at any one time. However, because of the complexity of the converter controller 150, there may not be a guarantee that only one of the drive-high terminal 156 or the drive-low terminal 158 are asserted at any one time. Certain fault conditions may result in both the drive-high terminal 156 and the drive-low terminal 158 being asserted at the same time.

Even if the converter controller 150 can guarantee that the drive-high terminal 156 and the drive-low terminal 158 are never simultaneously asserted, shoot through may still occur based on the finite amount of time it takes the high-side FET 102 or the low-side FET 112 to transition between a fully conductive state and a non-conductive state. Consider, as an example, the first phase of the primary side in which the high-side FET 102 is fully conductive, and the low-side FET 112 is non-conductive. When the transition to the second phase occurs, the drive-high terminal 156 of the converter controller 150 is de-asserted, and immediately thereafter the drive-low terminal 158 is asserted. It takes a finite amount of time for the high-side FET 102 to transition from fully conductive to non-conductive, and the low-side FET 112 may become partially or fully conductive before the high-side FET 102 is non-conductive. Thus again, shoot through may occur causing damage to the high-side FET 102 and/or the low-side FET 112. The same issue may occur when the low-side FET 112 is transitioning to non-conductive as the high-side FET is transitioning to conductive.

Still referring to FIG. 1. In the example system, the gate driver 160 is disposed electrically between the converter controller 150 and the gates of the high-side FET 102 and the low-side FET 112. The gate driver 160 may perform several functions. In one example function, the gate driver 160 may provide gate voltages and current to drive the high-side FET 102 and the low-side FET 112, such that the converter controller 150 need not be designed and constructed to source the currents and voltages used make the FETs conductive. In another example function, the gate driver 160 may be used to address the possibility of a fault condition in the converter controller 150 in which both the drive-high terminal 156 and the drive-low terminal 158 are simultaneously asserted. That is, if both the drive-high terminal 156 and the drive-low terminal 158 are simultaneously asserted, the gate driver ensures that the simultaneous assertion is not carried through to the respective gates of the high-side FET 102 and the low-side FET 112. In yet another example function, the gate driver 160 inserts dead times or delay times between assertions of the respective gates of the high-side FET 102 and the low-side FET 112 to address the finite amount of time it may take for a FET to transition between fully conductive and non-conductive.

In particular, the example gate driver 160 defines an in-high terminal 170, an in-low terminal 172, a drive-high terminal 174, a drive-low terminal 176, a power terminal 178, a vboot terminal 180, and a bridge terminal 182. The power terminal 178 is coupled to the source of DC operational power $V_{CC}$. The in-high terminal 170 is coupled to the drive-high terminal 156 of the converter controller 150, and the in-low terminal 172 is coupled to the drive-low terminal 158 of the converter controller 150. The drive-high terminal 174 is coupled to the gate 110 of the high-side FET 102, and the drive-low terminal 176 is coupled to the gate 118 of the low-side FET 112. The vboot terminal 180 is coupled to the source of DC operational power $V_{CC}$ by way of a diode 184, and the vboot terminal 180 is also coupled to the switch node 108 by way of a capacitor 186. Finally, the bridge terminal 182 is coupled to the switch node 108.

Figure 2:
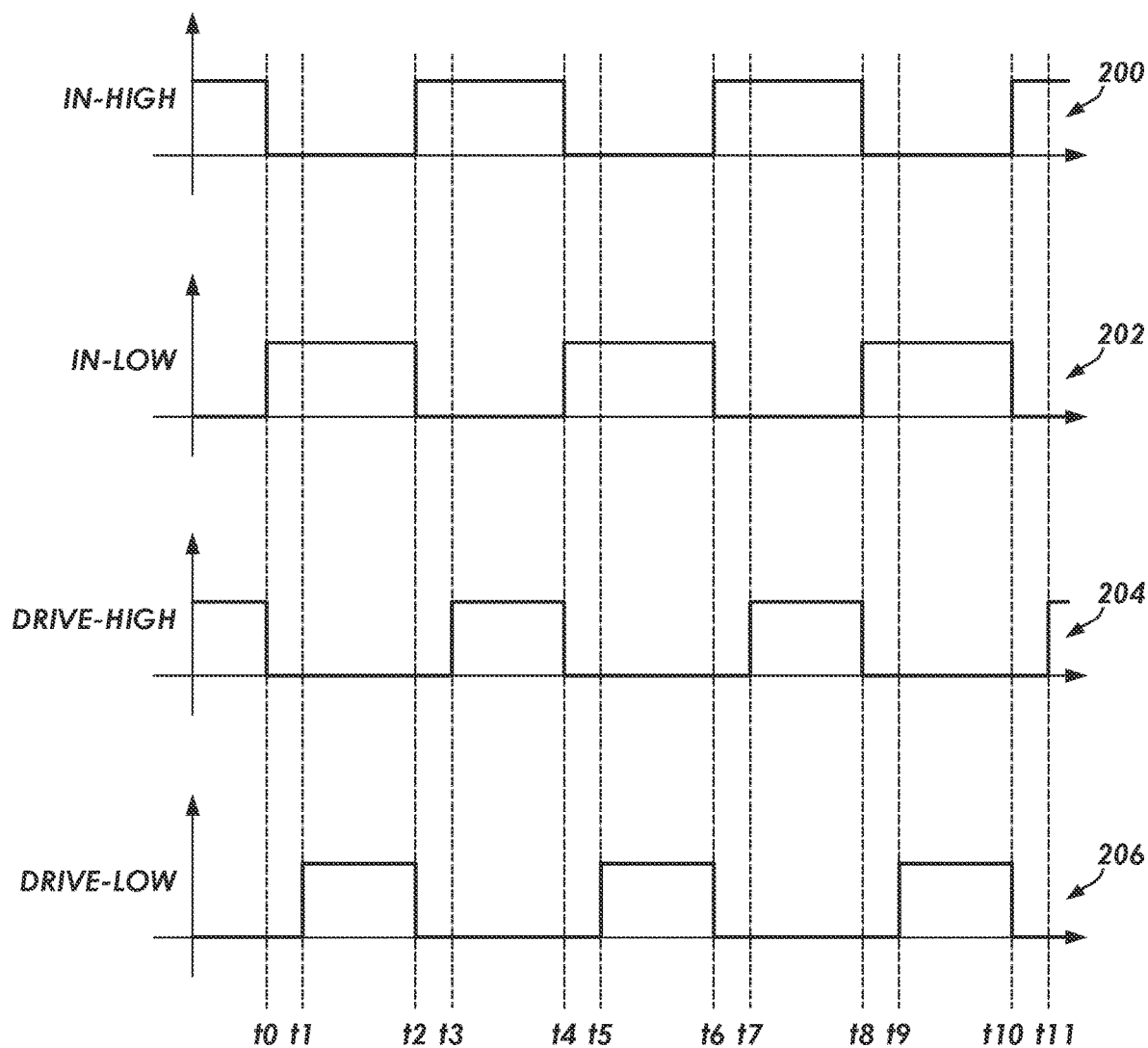
FIG. 2 shows a timing diagram in accordance with at least some embodiments.

FIG. 2 shows an example timing diagram of operation of the gate driver 160. In particular, FIG. 2 shows a plurality of signals plotted along corresponding time axes. More particularly still, FIG. 2 shows an example: in-high signal 200 that may be received at the in-high terminal 170; in-low signal 202 that may be received at the in-low terminal 172; a drive-high signal 204 that may be driven to the drive-high terminal 174; and a drive-low signal 206 that may be driven to the drive-low terminal 176. In the example of FIG. 2, the various signals are shown asserted high; however, the asserted state of the signals may be selected at the discretion of the circuit designer. Moreover, the asserted state as between the signals need not be the same (e.g., some signals may be asserted high, while other signals may be asserted low).

In the example case of the power converter 100 having an LLC resonant primary, the converter controller 150 may assert the in-high signal 200 and the in-low signal 202 at the operational frequency, with a 50% duty cycle, but with opposite phases. For example, the in-high signal 200 is shown as asserted between times t2 and t4, while the in-low signal 202 is shown asserted between times t4 and t6. For a power converter with an LLC resonant primary, the frequency changes as a function of load, but the duty cycle of each phase stays at 50%, except perhaps during load transients. For non-resonant power converters, the converter controller 150 may modulate the duty cycle of the in-high signal 200 as a function of load, and the length of the asserted state of the in-low signal 202 may be relatively constant. In yet still other non-resonant controllers, the asserted time of the in-high signal 200 may be constant (e.g., constant on-time controllers), and the frequency of operation may change as a function of load.

Regardless of the precise type of power converter utilizing the gate driver 160, the upstream converter controller 150 may simultaneously, or very near simultaneously, transition the in-high signal and the in-low signal. That is, for example, a falling edge of the in-high signal 200 may align in time with a rising edge of the in-low signal 202, such as at time t0. As another example, a falling edge of the in-low signal 202 may align in time with a rising edge of the in-high signal 200, such as at time t2. Again, it may take a finite amount of time for a transistor, such as a FET, to transition from a conductive state to a non-conductive state, and thus simultaneous or near simultaneous transitioning of the signals risks shoot through.

The example gate driver 160 addresses the shoot through issue by inserting a delay time between de-asserting the drive-high signal 204 and asserting the drive-low signal 206. Similarly, the example gate driver 160 inserts a delay time between de-asserting the drive-low signal 206 and asserting the drive-high signal 204. Stated in terms of conductivity of the FETs, the example gate driver 160 inserts a delay time between making the high-side FET 102 non-conductive and making the low-side FET 112 conductive, and similarly inserts a delay time between making the low-side FET 112 non-conductive and making the high-side FET 102 conductive.

Still referring to FIG. 2, the example in-high signal 200 is asserted between times t2 and t4. The in-high signal 200 is de-asserted at time t4, and the corresponding drive-high signal 204 is de-asserted at time t4. The example in-low signal 202 goes asserted at time t4; however, the example gate driver 160 inserts a delay time such that the corresponding drive-low signal 206 goes asserted at time t5. Thus, the time duration between the rising edge of the in-low signal at time t4 and the rising edge of drive-low signal at time t5 is a delay time. Similarly, the in-low signal 202 is de-asserted at time t6, and the corresponding drive-low signal 206 is de-asserted at time t6. The example in-high signal 200 is asserted at time t6; however, the example gate driver 160 inserts a delay time such that the corresponding drive-high signal 204 is asserted at time t7. Thus, the time duration between times t6 and t7 is a delay time. The time durations between times t0 and t1, t2 and t3, t8 and t9, and t10 and t11 are also delay times. The delay times shown in FIG. 2 are not necessarily to scale in relation to the asserted times of the signals, and in fact are exaggerated for purposes of clarity.

One of the issues faced by related-art gate drivers is asymmetry of the delay times as between the transitions. For example, in related-art gate drivers, a first delay time may be inserted between de-assertion of the drive-high signal and assertion of the drive-low signal. A second delay time may be inserted between de-assertion of the drive-low signal and assertion of the drive-high signal. However, the durations may not match. The data sheet for one example related-art gate driver provides that the delay time variance as between the first and second delay times may typically be 20 nanoseconds (ns), with a maximum delay time variance of 35 ns. Taking into account propagation delay of signals through the related-art gate drivers (e.g., 100 ns typical), with operating frequencies in the megahertz range, variations as between the delay times can lead to non-trivial changes in duty cycle of the assertions of the respective gates of the high-side FET 102 and the low-side FET 112. The non-trivial changes in duty cycle adversely affect operation of power converters, particularly power converters with resonant primaries.

The example gate driver 160 is designed and constructed to address, at least in part, the issues of variance of the delay times inserted by the gate drivers of the related-art. In particular, the example gate driver 160 is designed and constructed to insert a first delay time between de-assertion of the drive-high terminal 174 and assertion of the drive-low terminal 176, the insertion of the first delay time based on the expiration of a timer implemented within the gate driver 160. Moreover, the example gate driver 160 is designed and constructed to insert a second delay time between de-assertion of the drive-low terminal 176 and assertion of the drive-high terminal 174, the insertion of the second delay time based on the expiration of the same timer implemented within the gate driver 160. Stated differently, the example gate driver 160 is designed and constructed to insert the first delay time based on assertion of a timer-end output from the timer implemented within the gate driver 160, and the example gate driver 160 is designed and constructed to insert the second delay time based on assertion of the timer-end output from the timer. By using the same timer for all the delay times, the variance between the delay times is significantly reduced.

Figure 3:
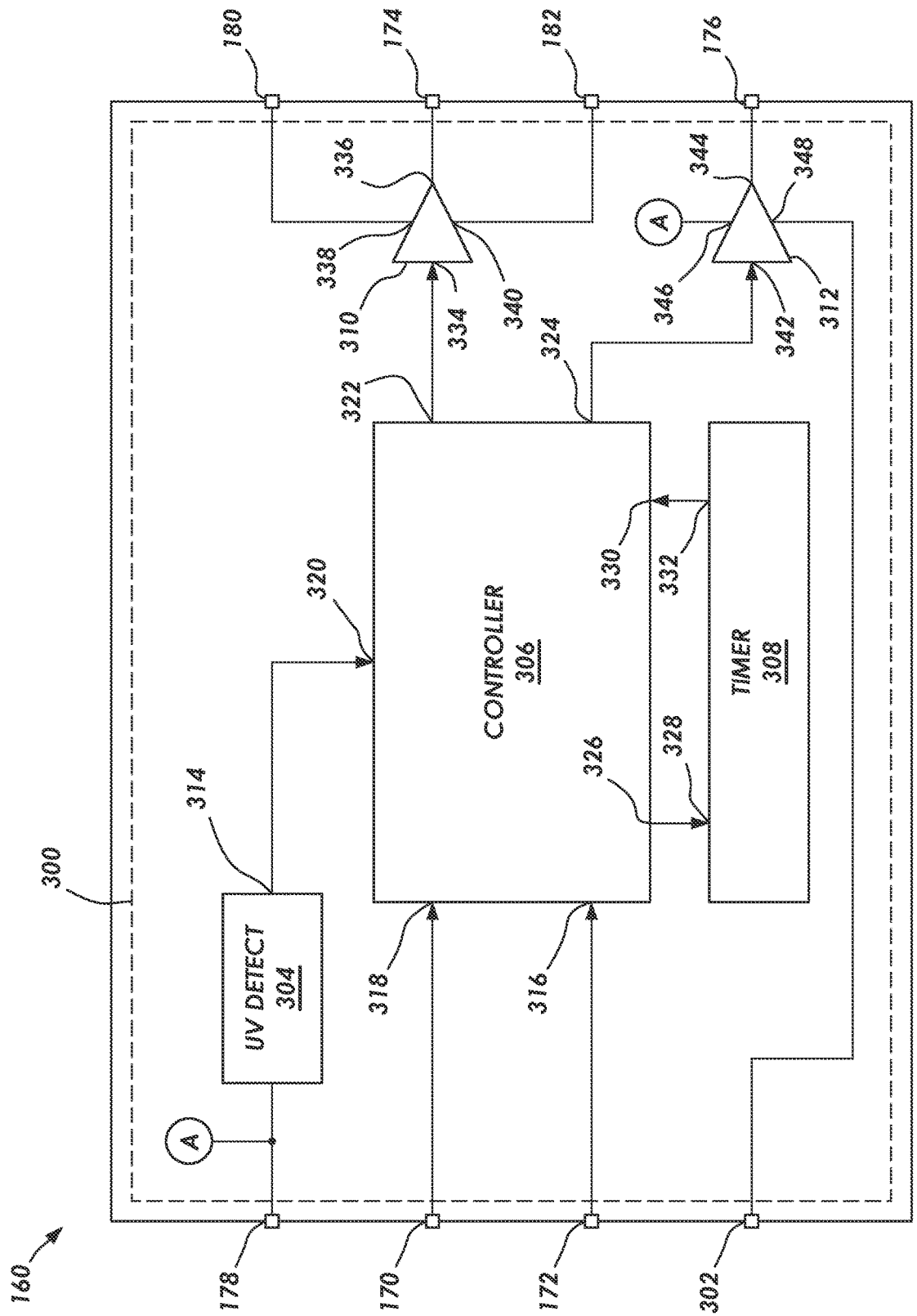
FIG. 3 shows a block diagram of a gate driver in accordance with at least some embodiments.

FIG. 3 shows a block diagram of an example gate driver 160. In particular, FIG. 3 shows that the gate driver 160 may comprise a substrate 300 of semiconductor material (for example, silicon) encapsulated within packaging to create a packaged semiconductor device or packaged semiconductor product. Bond pads or other connection points of the substrate 300 couple to respective terminals of the gate driver 160. While a single instance of the substrate 300 is shown, in other cases multiple substrates may be combined to form the gate driver 160 in the form of a multi-chip module.

The example gate driver 160 comprises a ground terminal 302, the in-high terminal 170, the in-low terminal 172, the power terminal 178, the drive-high terminal 174, the drive-low terminal 176, the vboot terminal 180, and the bridge terminal 182. Internally, the example gate driver 160 defines an under-voltage detector 304, a controller 306, a timer 308, a high-side amplifier 310, and a low-side amplifier 312. The under-voltage detector 304 is coupled to the power terminal 178. The under-voltage detector 304 is designed and constructed to sense an under-voltage condition of the DC operational power $V_{CC}$, and to assert an under-voltage output 314 to the controller 306.

The controller 306 defines an in-low input 316 coupled to the in-low terminal 172, and an in-high input 318 coupled to the in-high terminal 170. The example controller 306 defines under-voltage input 320 coupled to the under-voltage output 314 of the under-voltage detector 304. The example controller 306 defines drive-high output 322 coupled to the high-side amplifier 310, and drive-low output 324 coupled to the low-side amplifier 312. The example controller 306 further defines a timer-start output 326 coupled to a timer-start input 328 of the timer 308, and a timer-end input 330 coupled to a timer-end output 332 of the timer 308.

The example high-side amplifier 310 defines a drive input 334 coupled to the drive-high output 322, a drive output 336 coupled to the drive-high terminal 174, an upper rail 338 coupled to the vboot terminal 180, and a lower rail 340 coupled to the bridge terminal 182. When the drive input 334 is asserted, the high-side amplifier 310 couples the voltage on the vboot terminal 180 to the drive-high terminal 174, making the high-side FET 102 conductive. When the drive input 334 is de-asserted, the high-side amplifier 310 couples the switch node 108 to the drive-high terminal 174, making the high-side FET 102 non-conductive.

The example low-side amplifier 312 defines drive input 342 coupled to the drive-low output 324, a drive output 344 coupled to the drive-low terminal 176, an upper rail 346 coupled to the power terminal 178 (as shown by bubble "A"), and a lower rail 348 coupled to the ground terminal 302. When the drive input 342 is asserted, the low-side amplifier 312 couples the voltage on the power terminal 178 to the drive-low terminal 176, making the low-side FET 112 conductive. When the drive input 342 is de-asserted, the low-side amplifier 312 couples the ground terminal 302 to the drive-low terminal 176, making the low-side FET 112 non-conductive.

Still referring to FIG. 3, the example timer 308 is designed and constructed to begin the timing when the timer-start input 328 is asserted. At the end of the predetermined time, the example timer 308 asserts the timer-end output 332 to indicate the predetermined time has elapsed. The example timer 308 may take any suitable form. The timer 308 may be an analog circuit with a rising voltage indicating the passage of time. The timer 308 may be an analog circuit with a falling voltage indicating the passage of time. The timer 308 may be a digital circuit that counts up, or digital circuit that counts down. Regardless, once the predetermined time has elapsed, the predetermined time being a delay time, the timer 308 asserts the timer-end output 332. An example timer 308 is discussed in greater detail below.

The example controller 306 is designed and constructed to insert a first delay time between de-assertion of the drive-high terminal 174 and assertion of the drive-low terminal 176, the insertion of the first delay time based on the timer-end output 332 from timer 308. More particularly, in one example the controller 306 is designed and constructed to de-assert drive-high terminal 174 responsive to de-assertion of the in-high terminal 170, assert the timer-start input 328 of the timer 308, and then assert the drive-low terminal 176 upon assertion of the in-low terminal 172 and the timer-end output 332.

Similarly, the example controller 306 is designed and constructed to insert a second delay time between de-assertion of the drive-low terminal 176 and assertion of the drive-high terminal 174, the insertion of the second delay time based on the timer-end output 332 of the timer 308. More particularly, in one example the controller 306 is designed and constructed to de-assert drive-low terminal 176 responsive to de-assertion of the in-low terminal 172, assert the timer-start input 328 of the timer 308, and then assert the drive-high terminal 174 upon assertion of the in-high terminal 170 and the timer-end output 332. By using the same timer 308 for the delay times, the variance between the delay times is significantly reduced, in some cases reduced to 5 ns or less, and in one case reduced to 2 ns or less.

Any suitable design and construction for the controller 306 to implement use of a single timer 308 may be used. In one example, the controller 306 implements a state machine having a plurality of states, with transitions between the states based on the changes in the various inputs, including the timer-end input 330.

Figure 4:
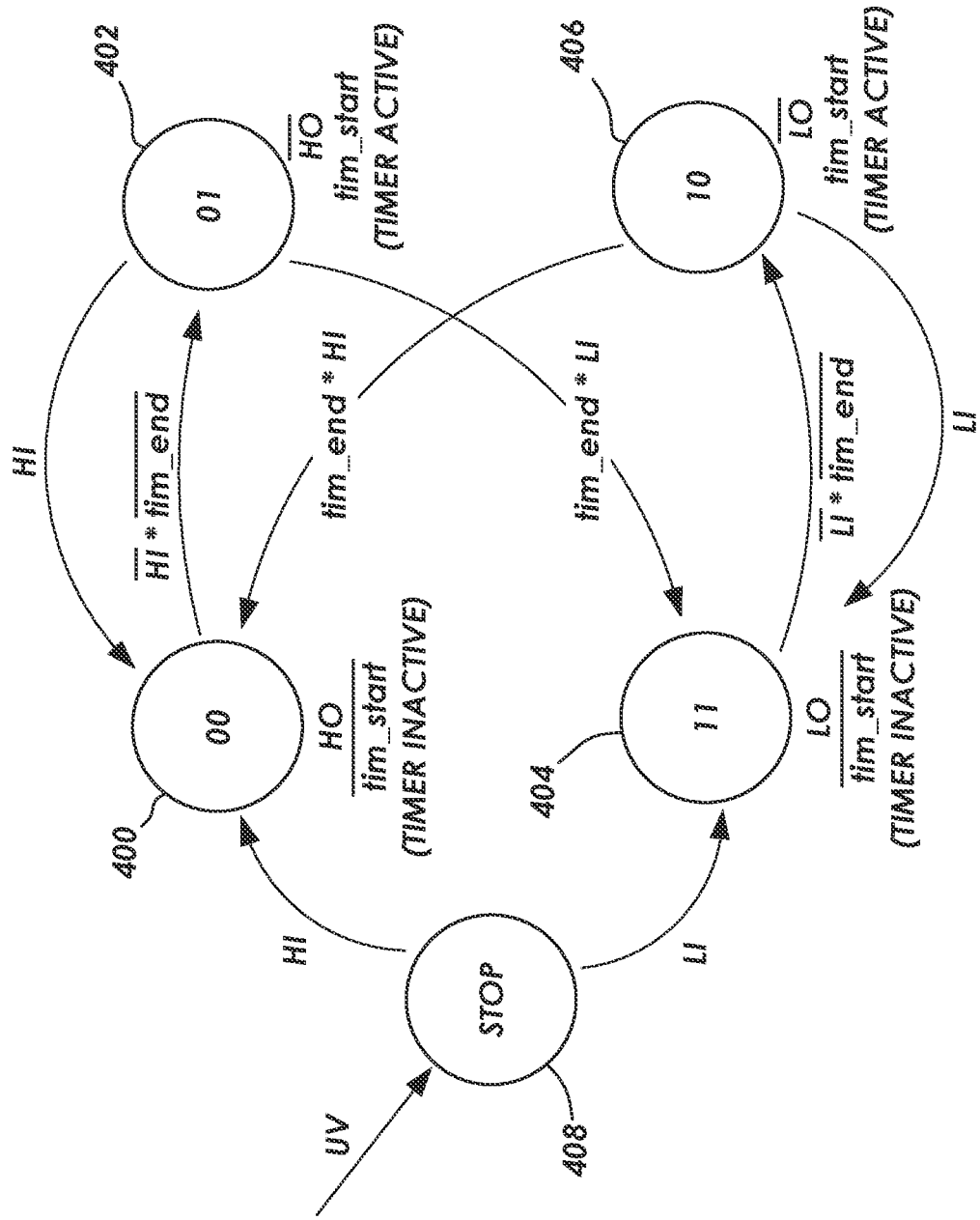
FIG. 4 shows an example state diagram of a state machine in accordance with at least some embodiments.

FIG. 4 shows an example state diagram of a state machine in accordance with at least some embodiments. The example state machine has at least four states, and as shown the state machine has five states. Within circles illustrating each state is a two bit number assigned to the state, but the two bit number assignments are arbitrary. The example STOP state has no number assigned, as in one example the STOP state represents a condition in which the various outputs are forced to respective de-asserted states. Below each of the active states is shown, in shorthand notation, the condition of various outputs when the state is active. For example, below the first state 400 is an indication that the drive-high terminal 174 (HO) is asserted, and the timer-start output 326 (tim_start) is de-asserted, the de-asserted state illustrated by the bar above the wording in the drawing. De-assertion of the timer-start input 328 of the timer 308 resets the timer 308 thereby de-asserting the timer-end output 332. The transitions between the states are shown by respective arrows, and the inputs that cause the transitions are shown overlaid on the respective arrows. For example, the transition from the first state 400 to the second state 402 occurs when the in-high terminal 170 (HI) is de-asserted and the timer-end input 330 (tim_end) is de-asserted.

Assume that, for purposes of explanation, the gate driver 160 is powered up and operational, and thus not in an under-voltage condition. Further assume that the state machine is in the first state 400 with the in-high terminal 170 asserted, drive-high terminal 174 (HO) asserted, and the timer-start output 326 (tim_start) de-asserted. The example state machine transitions from the first state 400 to the second state 402 upon occurrence of the in-high terminal 170 (HI) going de-asserted and the timer-end input 330 (tim_end) being de-asserted. That is to say, in most cases the state machine transitions from the first state 400 to the second state 402 when the in-high terminal 170 (HI) is de-asserted, but on the chance that the de-assertion of the in-high terminal 170 (HI) occurs before the time-end output 332 of the timer 308 is de-asserted, the example state machine stays in the first state 400 until the delay time reset and ready for a new run (e.g., the timer-end input 330 (tim_end) is de-asserted).

In the example second state 402, the drive-high terminal 174 (HO) is de-asserted and the timer-start output 326 (tim_start) is asserted. Thus, in the second state 402, the timer 308 is running to control the timing of the delay time between de-assertion of the drive-high terminal 174 and the assertion of the drive-low terminal 176. The example state machine transitions from the second state 402 to the third state 404 when the timer-end input 330 (tim_end) is asserted and the in-low terminal 172 (LI) is asserted. In many cases, the in-low terminal 172 (LI) goes asserted prior to the end of the delay time; however, the example state machine does not transition to the third state 404 unless and until the timer-end input 330 (tim_end) and the in-low terminal 172 (LI) are both asserted.

In the example third state 404, the drive-low terminal 176 (LO) is asserted and the timer-start output 326 (tim_start) is de-asserted. De-assertion of the timer-start input 328 of the timer 308 resets the timer 308 thereby de-asserting the timer-end output 332. The example state machine transitions from the third state 404 to the fourth state 406 upon occurrence of the in-low terminal 172 (LI) going de-asserted and the timer-end input 330 (tim_end) being de-asserted. That is to say, in most cases the state machine transitions from the third state 404 to the fourth state 406 when the in-low terminal 172 (LI) is de-asserted, but on the chance that the de-assertion of the in-low terminal 172 (LI) occurs before the timer-end output 332 of the timer 308 is de-asserted, the example state machine stays in the third state 404 until the timer 308 is correctly reset and ready for new run.

In the example fourth state 406, the drive-low terminal 176 is de-asserted (LO) and the timer-start output 326 is asserted (tim_start). Thus, in the fourth state 406 the timer 308 is running to control the timing of the delay time between de-assertion of the drive-low terminal 176 and the assertion of the drive-high terminal 174. The example state machine transitions from the fourth state 406 back to the first state 400 when the timer-end input 330 (tim_end) is asserted and the in-high terminal 170 (HI) is asserted. In many cases, the in-high terminal 140 (HI) goes asserted prior to the end of the delay time; however, the example state machine does not transition to the first state 400 unless and until the timer-end input 330 (tim_end) and the in-high terminal 170 (HI) are both asserted.

Still referring to FIG. 4, the example state machine also implements some transitions to account for unexpected input changes. For example, returning to the second state 402, the great majority of the transitions out of the second state 402 will be to the third state 404. However, if the converter controller 150 unexpectedly asserts the in-high terminal 170 (HI) while the state machine is in the second state 402, as shown in FIG. 4 the state machine transitions back to the first state 400 in which drive-high terminal 174 (HO) is asserted and the timer-start output 326 (tim_start) de-asserted. Similarly, returning to the fourth state 406, the great majority of the transitions out of the fourth state 406 will be to the first state 400. However, if the converter controller 150 unexpectedly asserts the in-low terminal 172 (LI) while the state machine is in the fourth state 406, as shown in FIG. 4 the state machine transitions back to the third state 404 where the drive-low terminal 176 (LO) is asserted and the timer-start output 326 (tim_start) is de-asserted.

The example state machine of FIG. 4 further implements the STOP state 408. The example STOP state is entered when the under-voltage detector 304 asserts the under-voltage input 320. In many cases, the STOP state 408 entered at power up of the gate driver 160, and then the state machine transitions to the either the first state 400 or the third state 404 based on assertion of the in-high terminal 170 or the in-low terminal 172, respectively. In the example STOP state 408, the outputs of the state machine, such as the drive-high terminal 174 (HO), the drive-low terminal 176 (LO), and the timer-start output 326 (tim_start) are de-asserted. In one example implementation, the outputs of the state machine are de-asserted by being logically ANDed with a stop signal. When the stop signal is asserted, such as asserted low, the outputs of the state machine are de-asserted. When the stop signal is de-asserted, such as de-asserted high, the outputs are based on the state of the state machine.

In yet still other cases, the STOP state 408 of the state machine may have an assigned value. For a state machine having five states, at least three bits may be used for state assignments. For example, the STOP state 408 may be assigned the binary number "100", while the first state 400, second state 402, third state 404, and fourth state 406 may be assigned the binary numbers "000", "001", "011", and "010", respectively. In the example of a three-bit state machine, each of the four non-STOP states will additionally include a transition to the STOP state 408 upon assertion of the under-voltage input 320, but arrows associated with such transitions are not shown so as not to unduly complicate the figure.

Figure 5:
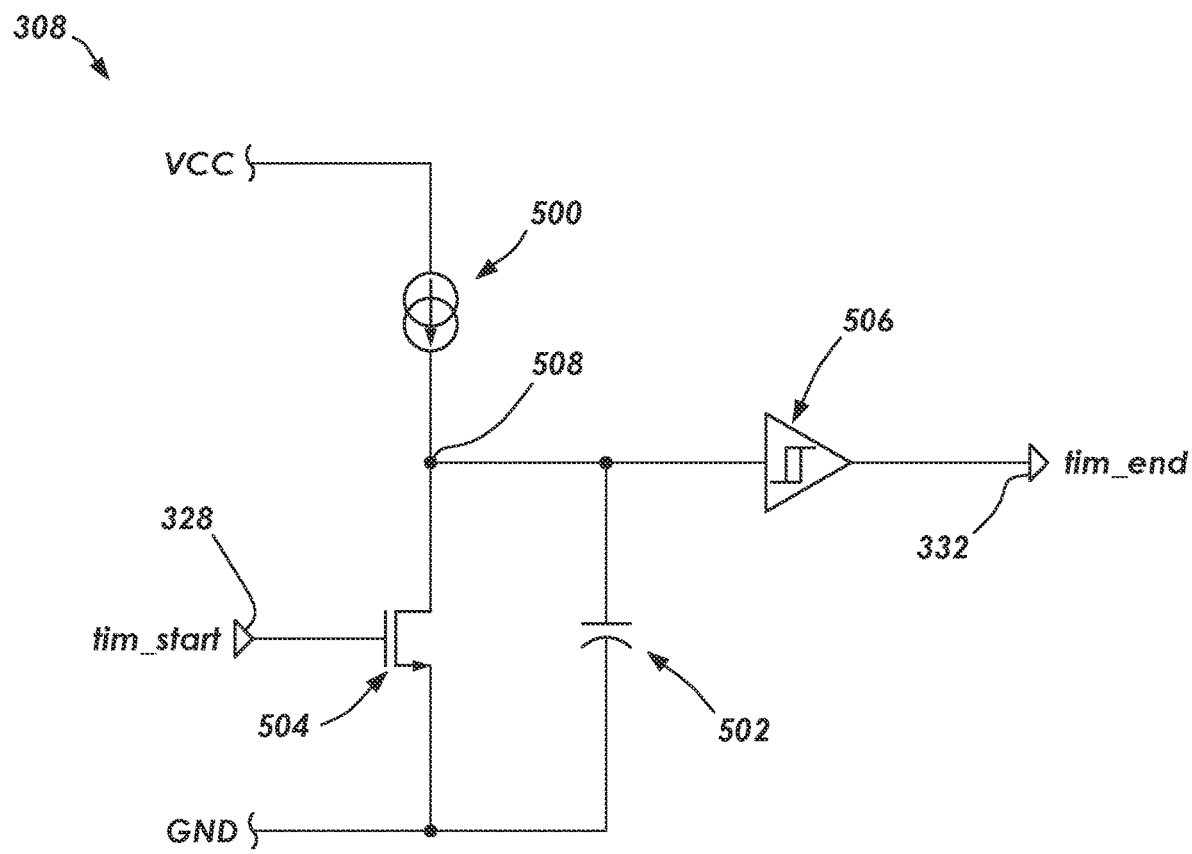
FIG. 5 shows an electrical schematic of a timer in accordance with at least some embodiments.

FIG. 5 shows an electrical schematic of an example timer 308. In particular, the example timer 308 comprises a current source 500, a capacitor 502, an electrically-controlled switch illustratively shown as a FET (and hereafter FET 504), and a buffer 506. The example current source 500 is coupled to the source of DC operational power $V_{CC}$ and defines a current output 508. The capacitor 502 defines a first lead coupled to the current output 508, and a second lead coupled to a reference voltage, such as ground. The FET 504 defines a first lead or drain coupled to the first lead of the capacitor 502, a second lead or source coupled to the second lead of the capacitor, and a control input or gate defining the timer-start input 328. The buffer 506, illustratively shown as a non-inverting Schmidt trigger, defines a buffer input coupled to the first lead of the capacitor 502, and a buffer output defining the timer-end output 332.

In operation, when the timer-start input 328 is de-asserted, the FET 504 is conductive, shorting the capacitor 502. Thus, for this example timer 308, the timer-start input 328 is de-asserted high and thus asserted low. When the timer-start input 328 is asserted, the example FET 504 is non-conductive, and thus the current source 500 charges the capacitor 502. When the voltage on the capacitor 502 meets or exceeds a predetermined voltage, here the trigger voltage for the Schmidt trigger of the buffer 506, the buffer asserts the timer-end output 332. By selecting the amplitude of the current provided by the current source 500 and/or the size of the capacitor 502, the time duration of the timer 308 is set, and thus the time duration of the delay time is set.

The example timer 308 of FIG. 5 is an analog circuit with a rising voltage indicating the passage of time. Again, however, the timer 308 may be an analog circuit with a falling voltage indicating the passage of time, a digital circuit that counts up, or digital circuit that counts down. Regardless, once the predetermined time has elapsed, the predetermined time being a delay time, the timer 308 asserts the timer-end output 332.

Figure 6:
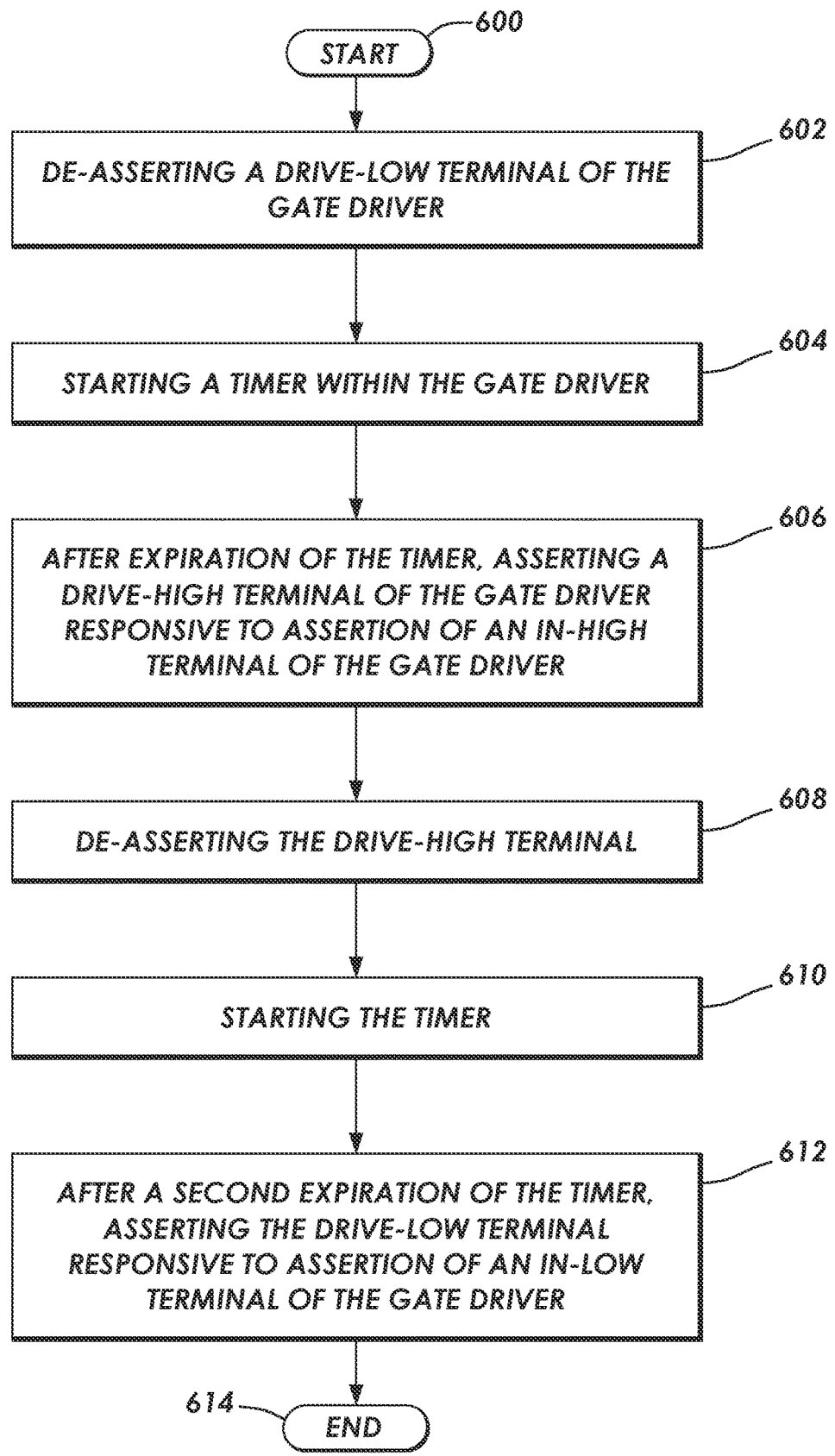
FIG. 6 shows a method in accordance with at least some embodiments.

FIG. 6 shows an example method. In particular, the example method starts (block 600) and comprises: de-asserting a drive-low terminal of the gate driver (bock 602); starting a timer within the gate driver (block 604); after expiration of the timer, asserting a drive-high terminal of the gate driver responsive to assertion of an in-high terminal of the gate driver (block 606); de-asserting the drive-high terminal (block 608); starting the timer (block 610); and after a second expiration of the timer, asserting the drive-low terminal responsive to assertion of an in-low terminal of the gate driver (block 612). Thereafter, the method ends (block 614), likely to be restarted in the next cycle of the power converter.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method of operating a gate driver, the method comprising:
   de-asserting a drive-low terminal of the gate driver;
   starting a single timer within the gate driver; and after expiration of the single timer
   asserting a drive-high terminal of the gate driver responsive to assertion of an in-high terminal of the gate driver; and then
   de-asserting the drive-high terminal;
   starting the single timer; and after a second expiration of the single timer
   asserting the drive-low terminal responsive to assertion of an in-low terminal of the gate driver.

2. The method of claim 1:
   wherein each starting the single timer comprises charging a capacitor by way of a current source; and
   wherein expiration of the single timer comprises a voltage on the capacitor meeting or exceeding a predetermined voltage.

3. The method of claim 1 further comprising implementing, by the gate driver, a state machine having at least four states:
   a first state in which the drive-high terminal is asserted and a timer-start input of the single timer is de-asserted;
   a second state in which the drive-high terminal is de-asserted and the timer-start input is asserted starting the single timer, the state machine transitions from the first state to the second state based on de-assertion of the in-high terminal;
   a third state in which the drive-low terminal is asserted and the timer-start input is de-asserted, the state machine transitions from the second state to the third state based on assertion of the in-low terminal and assertion of a timer-end output;
   a fourth state in which the drive-low terminal is de-asserted and the timer-start input is asserted, the state machine transitions from the third state to the fourth state based on de-assertion of the in-low terminal; and
   wherein the state machine transitions from the fourth state to the first state based on assertion of the in-high terminal and assertion of the timer-end output.

4. The method of claim 3 wherein the state machine transitions from the first state to the second state based on de-assertion of the in-high terminal and de-assertion of the timer-end output.

5. The method of claim 3 wherein the state machine transitions from the third state to the fourth state based on de-assertion of the in-low terminal and de-assertion of the timer-end output.

6. A gate driver, comprising:
   an in-high terminal, an in-low terminal, a drive-high terminal, and a drive-low terminal;
   a high-side amplifier defining a drive output coupled to the drive-high terminal, and a drive input;
   a low-side amplifier defining a drive output coupled to the drive-low terminal, and a drive input;
   a timer defining a timer-start input, and a timer-end output;
   a controller coupled to the in-high terminal, the in-low terminal, the drive input of the high-side amplifier, the drive input of the low-side amplifier, the timer-start input, and the timer-end output, the controller configured to:
      insert a first delay time between de-assertion of the drive-high terminal and assertion of the drive-low terminal, the insertion of the first delay time based on the timer-end output; and
      insert a second delay time between de-assertion of the drive-low terminal and assertion of the drive-high terminal, the insertion of the second delay time based on the timer-end output.

7. The gate driver of claim 6:
   wherein when the controller inserts the first delay time, the controller is configured to de-assert the drive-high terminal, assert the timer-start input, and then assert the drive-low terminal upon assertion of the timer-end output; and
   wherein when the controller inserts the second delay time, the controller is configured to de-assert the drive-low terminal, assert the timer-start input, and then assert the drive-high terminal upon assertion of the timer-end output.

8. The gate driver of claim 6 wherein the controller further comprises a state machine having at least four states:
   a first state in which the drive-high terminal is asserted and the timer-start input is de-asserted;
   a second state in which the drive-high terminal is de-asserted and the timer-start input is asserted, the controller transitions from the first state to the second state based on de-assertion of the in-high terminal;
   a third state in which the drive-low terminal is asserted and the timer-start input is de-asserted, the controller transitions from the second state to the third state based on assertion of the in-low terminal and assertion of the timer-end output;
   a fourth state in which the drive-low terminal is de-asserted and the timer-start input is asserted, the controller transitions from the third state to the fourth state based on de-assertion of the in-low terminal; and
   wherein the controller transitions from the fourth state to the first state based on assertion of the in-high terminal and assertion of the timer-end output.

9. The gate driver of claim 8 wherein the controller further comprises a fifth state, the controller transitions to the fifth state upon detection of an under-voltage event.

10. The gate driver of claim 8 wherein the controller transitions from the first state to the second state based on de-assertion of the in-high terminal and de-assertion of the timer-end output.

11. The gate driver of claim 8 wherein the controller transitions from the third state to the fourth state based on de-assertion of the in-low terminal and de-assertion of the timer-end output.

12. The gate driver of claim 6 wherein the timer comprises:
   a current source defining a current output;
   a capacitor defining a first lead coupled to the current output, and a second lead coupled to a reference voltage;

an electrically-controlled switch defining a first lead coupled to the first lead of the capacitor, a second lead coupled to the second lead of the capacitor, and a control input defining the timer-start input; and a buffer defining a buffer input coupled to the first lead of the capacitor, and a buffer output defining the timer-end output.

13. A power converter comprising:

a high-side FET defining a drain coupled to a voltage input, a source defining a switch node, and a gate;

a low-side FET defining a drain coupled to the switch node, a source coupled to a reference voltage, and a gate;

an inductance coupled to the switch node;

a rectifier coupled to the inductance;

a gate driver defining an in-high terminal, an in-low terminal, a drive-high terminal coupled to the gate of the high-side FET, and a drive-low terminal coupled to the gate of the low-side FET;

a converter controller coupled to the in-high terminal and the in-low terminal, the converter controller configured to alternately assert the in-high terminal and the in-low terminal;

the gate driver configured to:
  insert a first delay time between de-assertion of the drive-high terminal and assertion of the drive-low terminal based on a timer within the gate driver, and
  insert a second delay time between de-assertion of the drive-low terminal and assertion of the drive-high terminal based on the timer.

14. The power converter of claim 13:

wherein when the gate driver inserts the first delay time, the gate driver is configured to de-assert the drive-high terminal, start the timer, and then assert the drive-low terminal upon assertion of a timer-end output; and wherein when the gate driver inserts the second delay time, the gate driver is configured to de-assert the drive-low terminal, start the timer, and then assert the drive-high terminal upon assertion of the timer-end output.

15. The power converter of claim 13 wherein the timer comprises:

a current source defining a current output;

a capacitor defining a first lead coupled to the current output, and a second lead coupled to a reference voltage;

an electrically-controlled switch defining a first lead coupled to the first lead of the capacitor, a second lead coupled to the second lead of the capacitor, and a control input defining a timer-start input; and a buffer defining a buffer input coupled to the first lead of the capacitor, and a buffer output defining a timer-end output.

16. The power converter of claim 13 wherein the gate driver further comprises a state machine having at least four states:

a first state in which the drive-high terminal is asserted and a timer-start input is de-asserted;

a second state in which the drive-high terminal is de-asserted and the timer-start input is asserted, the gate driver transitions from the first state to the second state based on de-assertion of the in-high terminal;

a third state in which the drive-low terminal is asserted and the timer-start input is de-asserted, the gate driver transitions from the second state to the third state based on assertion of the in-low terminal and assertion of a timer-end output;

a fourth state in which the drive-low terminal is de-asserted and the timer-start input is asserted, the gate driver transitions from the third state to the fourth state based on de-assertion of the in-low terminal; and wherein the gate driver transitions from the fourth state to the first state based on assertion of the in-high terminal and assertion of a timer-end output.

17. The power converter of claim 16 wherein the gate driver transitions from the first state to the second state based on de-assertion of the in-high terminal and de-assertion of the timer-end output.

18. The power converter of claim 16 wherein the gate driver transitions from the third state to the fourth state based on de-assertion of the in-low terminal and de-assertion of the timer-end output.

19. The power converter of claim 13 wherein the inductance is an inductor having a first lead coupled to the switch node, and a second lead coupled to the rectifier.

20. The power converter of claim 13 wherein the inductance is a transformer having a primary winding coupled to the switch node, and a secondary winding coupled to the rectifier.

* * * * *